(12) United States Patent
Matsuda et al.

(10) Patent No.: US 7,417,867 B1
(45) Date of Patent: Aug. 26, 2008

(54) PRINTED WIRING BOARD AND DISPLAY APPARATUS

(75) Inventors: Yoshinari Matsuda, Kanagawa (JP); Yoshio Suzuki, Kanagawa (JP); Ryota Odake, Tokyo (JP); Nobutoshi Asai, Kanagawa (JP)

(73) Assignee: Sony Corporation, Tokyo (JP)

( * ) Notice: Subject to any disclaimer, the term of this patent is extended or adjusted under 35 U.S.C. 154(b) by 245 days.

(21) Appl. No.: 09/671,436

(22) Filed: Sep. 27, 2000

(30) Foreign Application Priority Data

Sep. 27, 1999 (JP) .................................. 11-271950

(51) Int. Cl.
*H05K 7/02* (2006.01)
(52) U.S. Cl. .................... 361/752; 361/757; 361/739; 361/760; 174/255; 174/260; 349/150
(58) Field of Classification Search ................. 361/748, 361/750–752, 760, 761, 765, 767, 768, 772, 361/736, 764, 763, 737, 739, 757; 174/250, 174/255, 260–263; 313/504, 506, 509–512; 349/150, 158
See application file for complete search history.

(56) References Cited

U.S. PATENT DOCUMENTS

| | | | |
|---|---|---|---|
| 3,504,214 A | 3/1970 | Lake et al. | |
| 3,634,714 A | 1/1972 | Anderson et al. | |
| 4,415,403 A | 11/1983 | Bakewell | |
| 4,702,566 A | 10/1987 | Tukude | |
| 5,150,005 A * | 9/1992 | Yokono | ........................ 313/495 |
| 5,243,142 A * | 9/1993 | Ishikawa et al. | ............. 174/262 |
| 5,319,159 A | 6/1994 | Watanabe et al. | |
| 5,432,015 A | 7/1995 | Wu et al. | |
| 5,436,744 A * | 7/1995 | Arledge et al. | ................. 359/82 |
| 5,463,191 A * | 10/1995 | Bell et al. | .................... 174/263 |
| 5,559,399 A | 9/1996 | Tanski et al. | |
| 5,597,518 A * | 1/1997 | Lovoi | ......................... 264/1.21 |
| 5,739,634 A * | 4/1998 | Kinoshita et al. | ............ 313/496 |

(Continued)

FOREIGN PATENT DOCUMENTS

CN          2086959 U       10/1991

(Continued)

OTHER PUBLICATIONS

DE 00120919.6.

(Continued)

*Primary Examiner*—Dean A. Reichard
*Assistant Examiner*—Dameon E. Levi
(74) *Attorney, Agent, or Firm*—Sonnenschein Nath & Rosenthal LLP

(57) ABSTRACT

A printed wiring board includes a glass substrate provided with through-holes, conductive patterns provided on both surfaces of said glass substrate in such a manner as to be made conductive to each other via said through-holes, and a sealing member composed of a silver paste containing an epoxy resin as a binder provided to fill said through-holes. This printed wiring board is advantageous in that circuit parts can be connected to each other without use of any planar special region and moisture does not reach the circuit parts through the printed wiring board. A display apparatus capable of stably displaying pictures for a long-period of time is provided by using the printed wiring board.

12 Claims, 8 Drawing Sheets

U.S. PATENT DOCUMENTS

| | | | |
|---|---|---|---|
| 5,744,285 A | | 4/1998 | Felten et al. |
| 5,814,935 A | | 9/1998 | Ujihara |
| 5,834,327 A | * | 11/1998 | Yamazaki et al. .............. 438/30 |
| 6,061,105 A | * | 5/2000 | Nakagawa .................... 349/40 |
| 6,069,443 A | * | 5/2000 | Jones et al. ................. 313/504 |
| 6,339,197 B1 | * | 1/2002 | Fushie et al. ................ 174/262 |
| 6,392,356 B1 | * | 5/2002 | Stevens ................... 315/169.3 |
| 6,411,349 B2 | * | 6/2002 | Nakazwaw et al. ........... 349/42 |
| 6,452,117 B2 | * | 9/2002 | Curcio et al. ............... 174/262 |
| 6,476,783 B2 | * | 11/2002 | Matthies et al. .............. 345/82 |
| 6,479,763 B1 | * | 11/2002 | Igaki et al. ................. 174/262 |
| 6,570,639 B1 | * | 5/2003 | Manabe et al. .............. 349/190 |
| 6,577,057 B1 | * | 6/2003 | Yamamoto et al. .......... 313/495 |
| 2002/0153829 A1 | * | 10/2002 | Asai et al. ................... 313/496 |

FOREIGN PATENT DOCUMENTS

| | | |
|---|---|---|
| CN | 1108026 A | 9/1995 |
| DE | 33 19973 A1 | 12/1984 |
| DE | 195 01 577 C1 | 3/1996 |
| EP | 0 160 227 | 11/1985 |
| EP | 0 758 836 A2 | 2/1997 |
| FR | 2 445 090 | 7/1980 |
| GB | 2 038 101 A | 7/1980 |
| JP | 7-126350 A | 5/1995 |
| JP | 08-222852 | 8/1996 |
| JP | 11-126690 | 5/1999 |
| JP | 11126690 A | 5/1999 |
| JP | 11-224777 A | 8/1999 |

OTHER PUBLICATIONS

Search Report and Written Opinion from Austrian Patent Office for Application No. 200005368-6.

First Office Action of Corresponding Chinese Application.

* cited by examiner

PRINTED WIRING BOARD AND DISPLAY APPARATUS

RELATED APPLICATION DATA

The present application claims priority to Japanese Application No. P11-271950 filed Sep. 27, 1999, which application is incorporated herein by reference to the extent permitted by law.

BACKGROUND OF THE INVENTION

The present invention relates to a printed wiring board including conductive patterns, and a display apparatus including a display device and a drive component for driving the display device.

As one structure of electroluminescence (EL) display apparatus, there has been known a structure wherein a display device is packaged by using a protective glass board, which protects the display device and allows light emitted from the display device to pass therethrough, and a printed wiring board which includes an insulating substrate made from an organic synthetic resin and to which the display device and a drive component therefor are electrically connected.

The EL display apparatus having the above structure is disadvantageous in that since the insulating substrate of the printed wiring board is made from an organic synthetic resin, moisture is easy to permeate the printed wiring board and to reach the EL display device which is generally poor in moisture resistance, with a result that the EL display apparatus is difficult to stably display pictures for a long-period of time.

SUMMARY OF THE INVENTION

An object of the present invention is to provide a printed wiring board allowing circuit parts poor in moisture resistance to be stably operated for a long-period of time, and to provide a display apparatus capable of stably displaying pictures for a long-period of time by using the printed wiring board.

A printed wiring board according to a first invention includes a glass substrate provided with through-holes, and conductive patterns provided on both surfaces of the glass substrate in such a manner as to be made conductive to each other via the through-holes, and accordingly, by electrically connecting circuit parts to be electrically connected to each other to the conductive patterns provided on both the surfaces of the printed wiring board, these circuit parts can be electrically connected to each other without use of any planar special region.

Further, according to the printed wiring board of the first invention, the conductive patterns are formed on both the surfaces of the glass substrate and the through-holes provided in the glass substrate are filled with a sealing member. Accordingly, moisture does not permeate the printed wiring board. As a result, although the printed wiring board constitutes part of the packages for the circuit parts, moisture does not reach the circuit parts through the printed wiring board.

According to a printed wiring board according to a second invention, the glass substrate on both surfaces of which the conductive patterns are formed is a no-alkali glass substrate. The no-alkali glass contains a very small amount of alkali ions being relatively easy to be migrated. As a result, even when a voltage is applied to the glass substrate via the conductive patterns provided on both the surfaces of the glass substrate, the glass substrate causes less ion migration.

According to a printed wiring board of a third invention, the sealing member provided to fill the through-holes of the glass substrate is a conductive paste containing an epoxy resin as a binder. The epoxy resin has a high sealing performance, and the paste, which is a conductive material, is easy to fill the through-holes. As a result, it is possible to easily carry out works of making the conductive patterns on both the surfaces of the glass substrate conductive to each other and of sealing the through-holes.

According to a printed wiring board of a fourth invention, a conductive film is provided on an inner wall surface of each of the through-holes in such a manner as to connect the conductive patterns provided on both surfaces of the glass substrate to each other, and an inner space, inside the conductive film, of each through-hole is filled with the sealing member. Since the conductive film having a resistivity lower than that of the paste is formed on the inner wall surface of each through-hole, the conductive patterns on both the surfaces of the glass substrate can be connected to each other with a low resistance.

According to a printed wiring board of a fifth invention, the sealing member provided to fill an inner space, inside the conductive film, of each through-hole formed in the glass substrate is an epoxy resin. Since the epoxy resin has a high sealing performance, the sealing performance at the through-holes of the glass substrate becomes high.

According to a printed wiring board of a sixth invention, the surface of the sealing member exposed from each of the through-holes of the glass substrate is covered with a metal film. As a result, the sealing performance at the through-holes becomes high.

According to a printed wiring board of a seventh invention, each of the conductive patterns has a stacked structure of a chromium film and a copper film formed thereon. Since chromium has a high adhesiveness to the glass substrate and the copper has a low resistivity, the conductive pattern is less peeled from the glass substrate and becomes low in its resistance.

According to a printed wiring board of an eighth invention, each of the conductive patterns has a stacked structure of an epoxy resin film and a copper film formed thereon. Since the epoxy resin film can be easily formed on the glass substrate and copper has a low resistivity, each conductive pattern having a low resistance can be simply formed.

A display apparatus according to a ninth invention includes a printed wiring board having a glass substrate provided with through-holes, and conductive patterns provided on both surfaces of the glass substrate in such a manner as to be made conductive to each other via the through-holes; a display device provided on one surface of the printed wiring board in such a manner as to be connected to the conductive pattern provided on the one surface of the printed wiring board; and a drive component, for driving the display device, disposed on the other surface of the printed wiring board in such a manner as to be connected to the conductive pattern provided on the other surface of the printed wiring board. With this configuration, since the display device and the drive component therefor provided on both sides of the printed wiring board are electrically connected to each other via the through-holes, it is possible to eliminate the need of providing any region specialized for electrically connecting the display device to the drive component therefor. Further, since the display device ariu the drive component therefor are integrated with the printed wiring board, it is possible to reduce the total thickness of the display device, the drive component therefor, and the printed wiring board.

Further, according to the display apparatus of the ninth invention, the display device is provided on the one surface of the printed wiring board, the protective glass board is provided in such a manner as to face to the one surface of the printed wiring board, and a second sealing member is provided to surround the display device while being in contact with the printed wiring board and the protective glass board. These printed wiring board, protective glass board, and second sealing member constitute a package for the display device.

Of the parts constituting the package, the protective glass board and the second sealing member do not allow the permeation of moisture therethrough. On the other hand, the conductive patterns are provided on both surfaces of the glass substrate of the printed wiring board and the through-holes provided in the glass substrate are filled with a first sealing member. As a result, moisture is not allowed to permeate the printed wiring board and to reach the display device.

A display apparatus according to a tenth invention includes a printed wiring board having a glass substrate provided with through-holes and conductive patterns provided on both surfaces of the glass substrate in such a manner as to be made conductive to each other via the through-holes, a display device connected to the conductor pattern provided on one surface of the printed wiring board via bumps, and a drive component, for driving the display device, connected to the conductor pattern provided on the other surface of the printed wiring board. Accordingly, it is possible to eliminate the need of providing a planar region specialized for electrically connecting the display device and the drive component therefor on both the sides of the printed wiring board to each other. Further, since the display device is connected to the conductive pattern on one surface of the printed wiring board via the bumps, and the drive component for driving the display device is connected to the conductive pattern on the other surface of the printed wiring board, it is possible to reduce the total thickness of the display device, drive component therefor, and printed wiring board.

Further, according to the display apparatus of the tenth invention, a protective glass board is provided in such a manner as to face to the one surface of the printed wiring board, a display device is provided on the surface, facing to the printed wiring board, of the protective glass board, and a second sealing member is provided to surround the display device while being in contact with the printed wiring board and the protective glass board. These printed wiring board, protective glass board, and second sealing member constitute a package for the display device.

Of the parts constituting the package, the protective glass board and the second sealing member do not allow the permeation of moisture therethrough. On the other hand, the conductive patterns are provided on both surfaces of the glass substrate of the printed wiring board and the through-holes provided in the glass substrate are filled with a first sealing member. As a result, moisture is not allowed to permeate the printed wiring board and to reach the display device.

DETAILED DESCRIPTION OF THE PREFERRED EMBODIMENTS

Hereinafter, first and second embodiments in each of which the present invention is applied to a simple matrix type EL display apparatus and a printed wiring board used therefor will be described with reference to FIGS. 1 to 9D.

Figure 3:
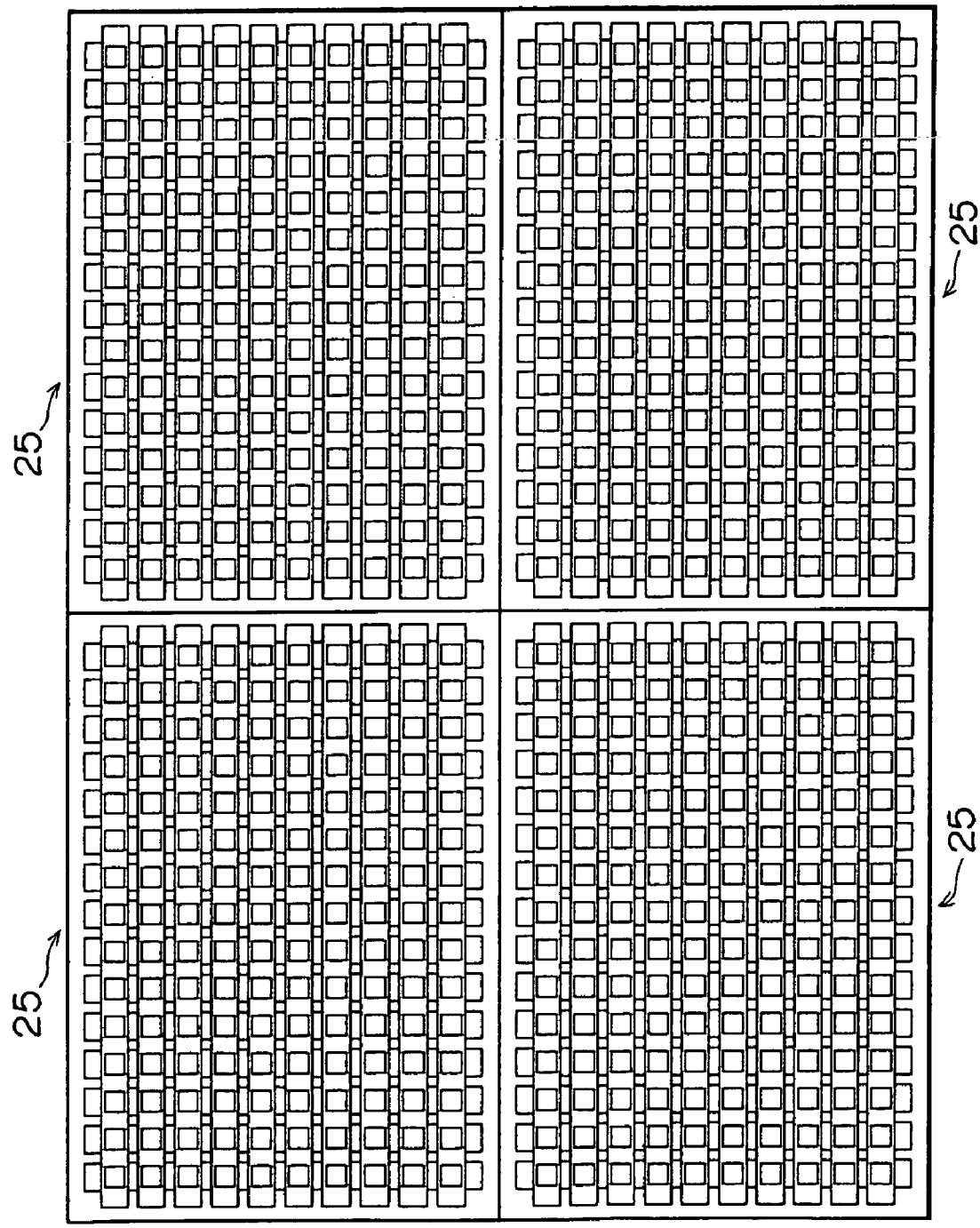
FIG. 3 is a plan view of a plurality of the printed wiring boards according to the first embodiment, which are flatly stuck to each other.
Figure 4A:
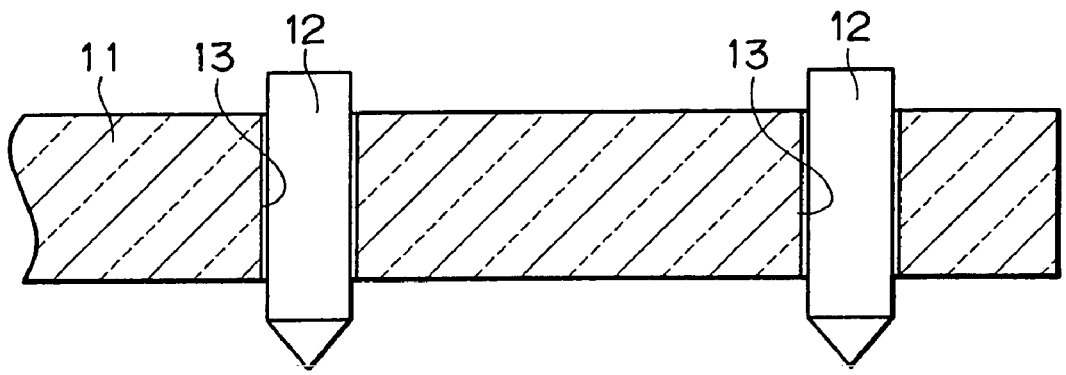
FIGS. 4A to 4D are partial sectional side views showing, in sequence, initial steps of fabricating the EL display apparatus according to the first embodiment.

A method of fabricating a printed wiring board and an EL display apparatus according to the first embodiment will be described with reference to FIGS. 1 to 6C. As shown in FIG. 4A, a glass substrate 11 of 1.1 mm in thickness made from a no-alkali glass is prepared, and through-holes 13 are formed in the glass substrate 11 at positions corresponding to those of anode electrodes and cathode electrodes necessary for a simple matrix type EL display apparatus by turning a diamond drill 12 or turning the diamond drill 12 while imparting ultrasonic waves to the diamond drill 12.

Figure 4B:
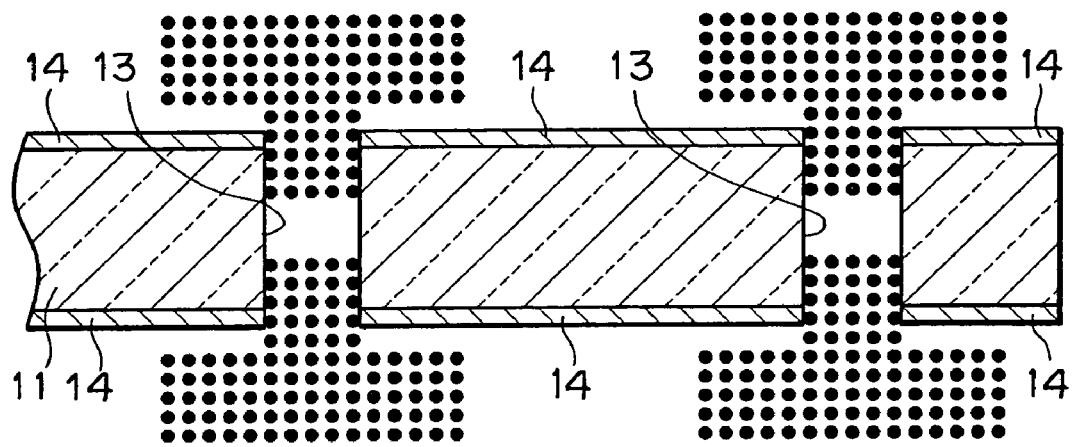

The diamond drill 12 is formed by electrodepositing fine particles of diamond on the surface of an ultra-high hardness steel containing typically Cr, Mo, W, Mn, Ni, and Ti, or sintering a mixture of a powder of the ultra-high hardness steel and fine particles of diamond. The frequency and energy of ultrasonic waves are set at about 20 kHz and 500 W, respectively. The turning of the diamond drill 12 with ultrasonic waves imparted to the diamond drill 12 allows the formation of the through-holes 13 with inner wall surfaces desirably finished for a short-time. As shown in FIG. 4B, the through-holes 13 may be formed by covering the surface of the glass substrate 11 with a mask 14 except for areas at which the through-holes 13 are to be formed, and subjecting the glass substrate 11 partially covered with the mask 14 to sand blasting.

Figure 4C:
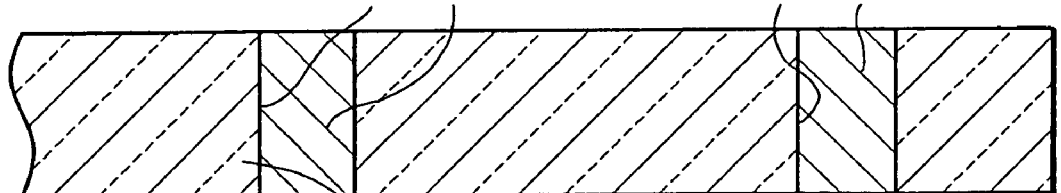
Figure 4D:
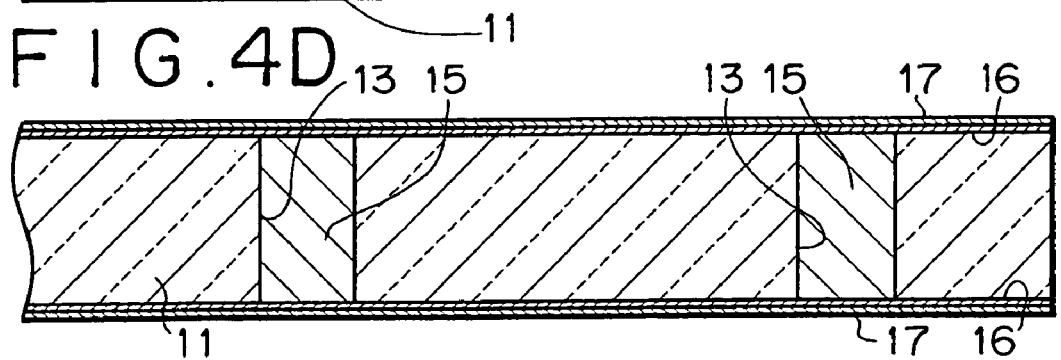

As shown in FIG. 4C, a silver paste 15 containing an epoxy resin as a binder is printed on the glass substrate 11, to fill the through-holes 13 with the silver paste 15. The silver paste 15 is then thermally hardened, and on each side of the glass substrate 11, an excess of the silver paste 15 on the surface of the glass substrate 11 is mechanically polished until the surfaces of the silver paste 15 portions in the through-holes 13 become the same level as that of the surface of the glass substrate 11. Then, as shown in FIG. 4D, a chromium film 16 and a copper film 17 each of which has a thickness of 0.3 μm or less are sequentially vapor-deposited overall on each surface of the glass substrate 11 including the surfaces of the silver paste 15 portions exposed from the through-holes 13. The chromium film 16 is formed for enhancing the adhesiveness between the glass substrate 11 and a conductive pattern, and the copper film 17 is formed for reducing the resistance of the conductive pattern.

Figure 5A:
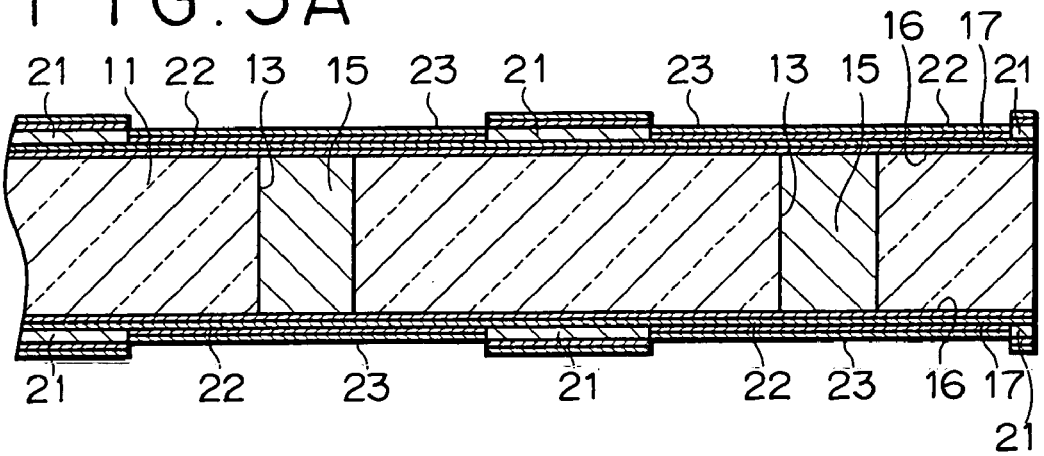
FIGS. 5A to 5C are partial sectional side views showing, in sequence, intermediate steps of fabricating the EL display apparatus according to the first embodiment.
Figure 5B:
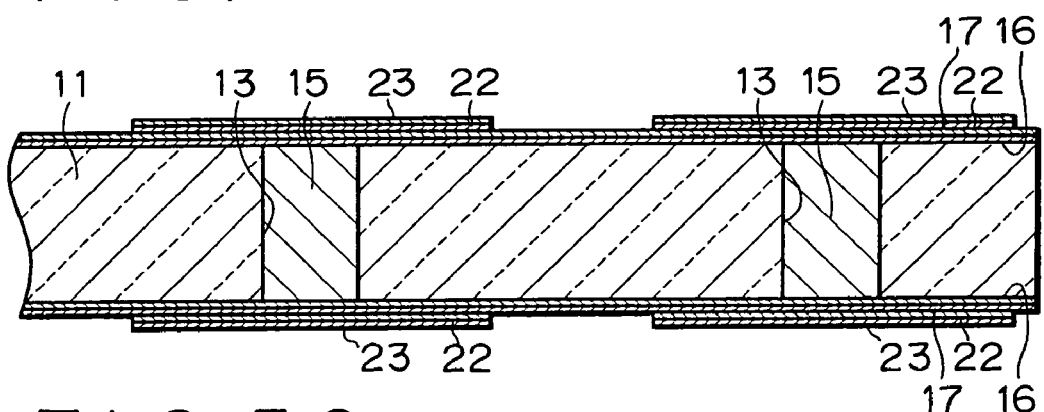

As shown in FIG. 5A, on each side of the glass substrate 11, a resist 21 is formed on the stack of the chromium film 16 and the copper film 17 except for areas at which a conductive pattern is to be formed, and a nickel film 22 and a gold film 23 each of which has a thickness of 0.3 µm or less are sequentially vapor-deposited. The nickel film 22 is formed for facilitating the vapor-depositing of the gold film 23. The gold film 23 is formed for preventing oxidation of the surface of the copper film 17 thereby facilitating the soldering of circuit parts to a conductive pattern. Then, as shown in FIG. 5B, the resist 21 is removed, to thereby lift-off the nickel film 22 and the gold film 23 except for the areas at which a conductive pattern is to be formed.

Figure 5C:
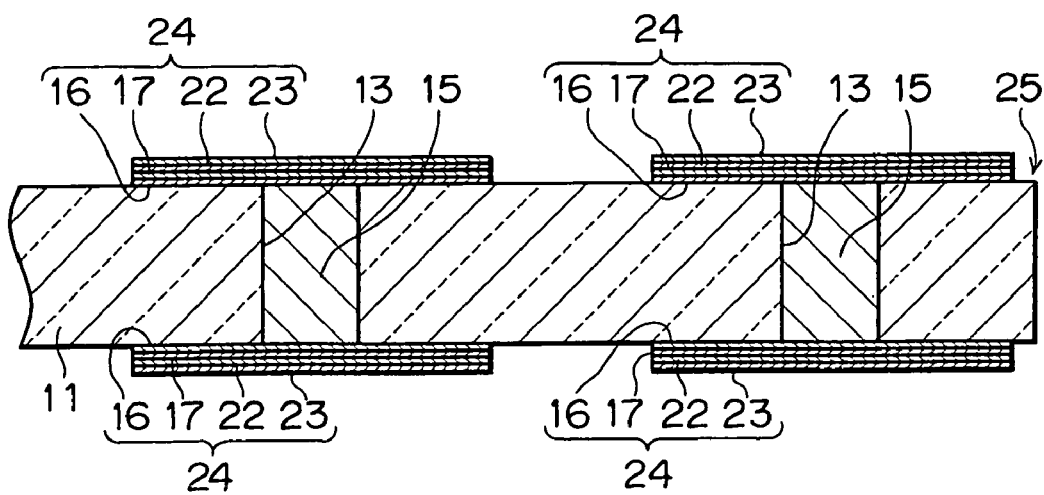

As shown in FIG. 5C, the copper film 17 and the chromium film 16 are partially removed by etching using the remaining portion of the gold film 23 as a mask. In this way, conductive patterns 24 each being composed of the chromium film 16, copper film 17, nickel film 22, and gold film 23 are provided on both the surfaces of the glass substrate 11 in such a manner as to be made conductive to each other via the silver paste 15 portions in the through-holes 13, to thus form a printed wiring board 25.

Figure 6A:
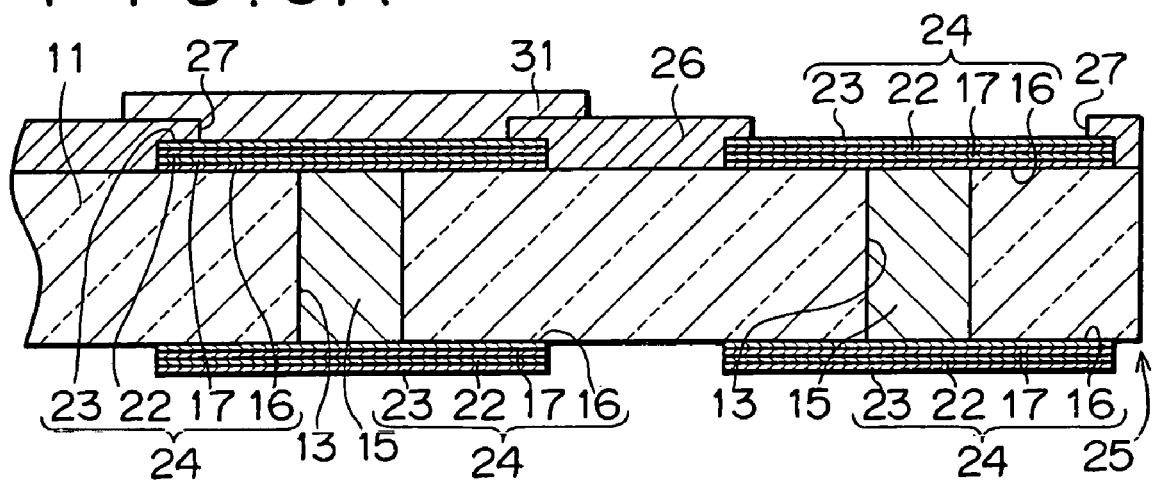
FIGS. 6A to 6C are partial sectional side views showing, in sequence, final steps of fabricating the EL display apparatus according to the first embodiment.
Figure 6B:
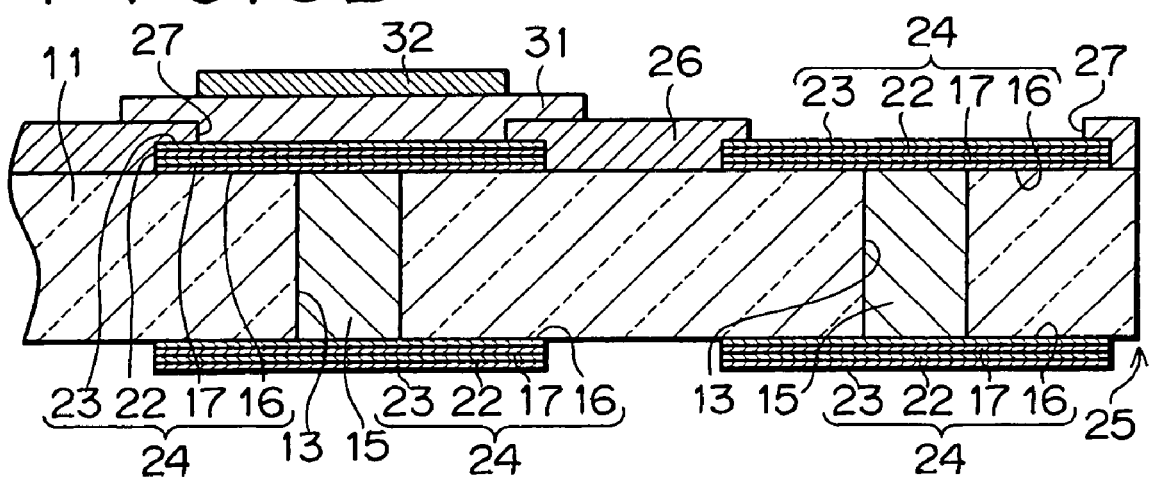

As shown in FIG. 6A, an insulating film 26 typically made from silicon oxide is vapor-deposited on one surface of the glass substrate 11, and openings 27 are formed in the insulating film 26 at connection portions between the conductive pattern 24 and anode electrodes and cathode electrodes. An aluminum film is vapor-deposited on the insulating film 26 and the like, and is patterned typically in the row direction to form cathode electrodes 31. Then, as shown in FIG. 6B, an EL light emitting layer 32 including an organic or inorganic light emitting layer, an electron transfer layer, and the like is vapor-deposited and is patterned to remain at display pixels which are intersections between the cathode electrodes 31 and anode electrodes.

Figure 6C:
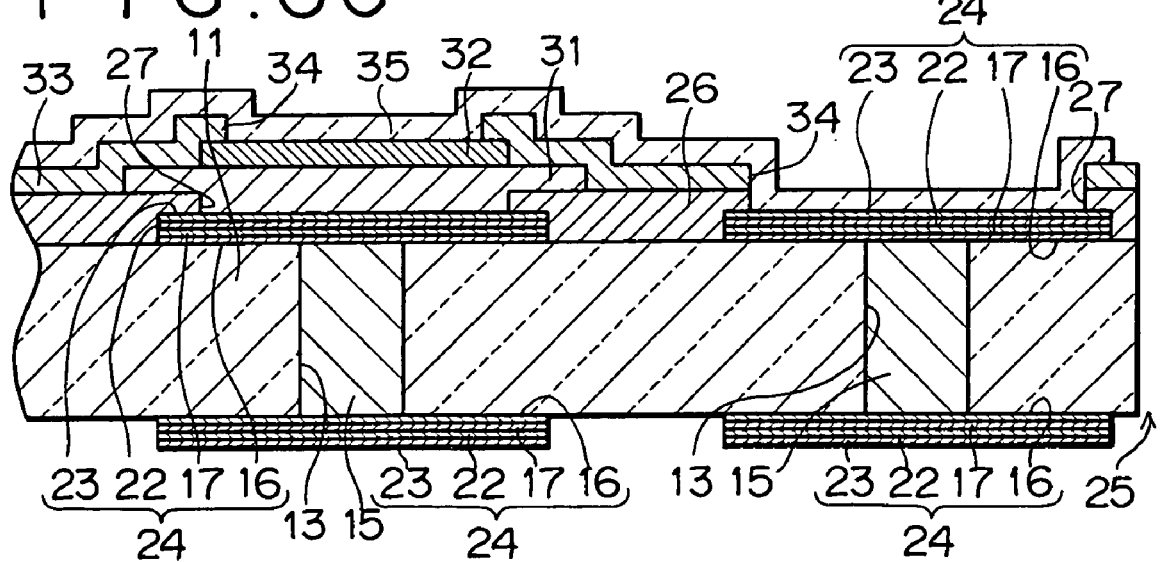

As shown in FIG. 6C, an insulating film 33 is vapor-deposited on the EL light emitting layer 32 and the like, and openings 34 are formed in the insulating film 33 at connection portions between the conductive pattern 24 and the EL light emitting layer 32 and anode electrodes. A transparent ITO (Indium Tin Oxide) film is vapor-deposited on the insulating film 33 and the like, and is pattern typically in the row direction to form anode electrodes 35. It should be noted that the ITO film may be replaced with an IXO film in which tin is replaced with another element insofar as the IXO film can form the transparent anode electrodes 35.

Figure 1:
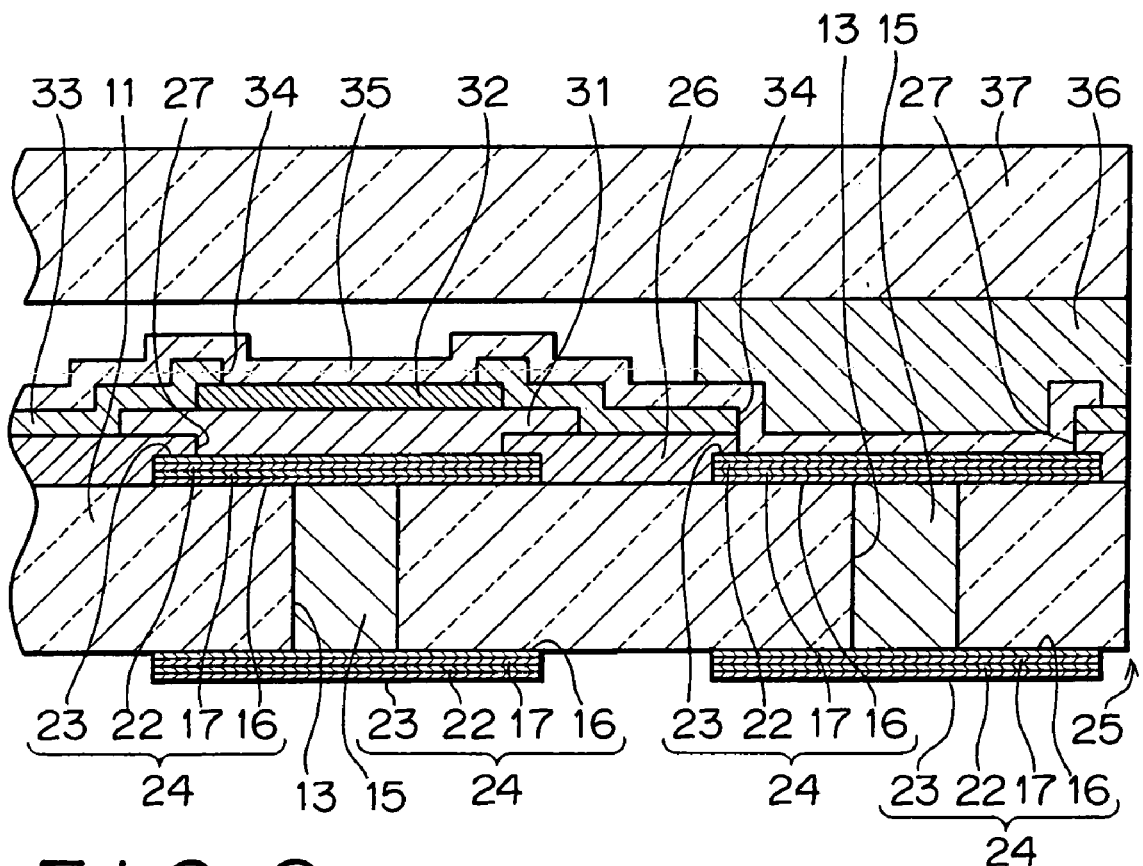
FIG. 1 is a partial sectional side view of an EL display apparatus according to a first embodiment of the present invention.

As shown in FIG. 1, an epoxy resin 36 is applied to the peripheral portion of the surface, on the EL light emitting layer 32 side, of the printed wiring board 25, and a protective glass board 37 is stuck on the printed wiring board 25 via the epoxy resin 36. Then, a drive component (not shown) for driving the EL light emitting layer 32 is soldered to the conductive pattern 24 formed on the surface, opposite to the EL light emitting layer 32, of the printed wiring board 25. According to an EL display apparatus thus fabricated, since the EL light emitting layer 32 and the drive component therefor are integrated with the printed wiring board 25, it is possible to reduce the total thickness of the EL light emitting layer 32, the drive component therefor, and the printed wiring board 25, and hence to make thin the entire EL display apparatus.

Figure 2:
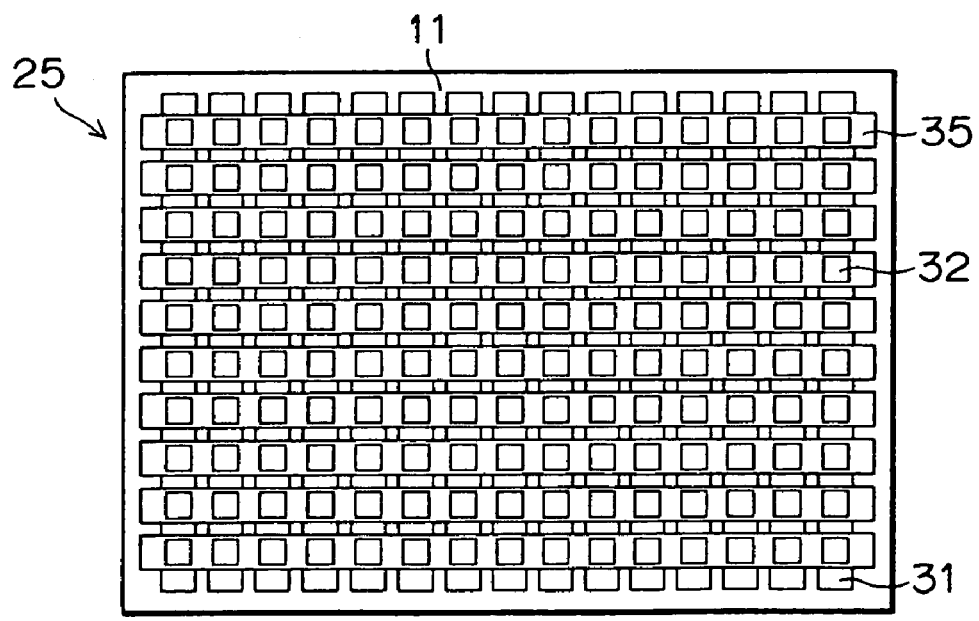
FIG. 2 is a plan view of a printed wiring board according to the first embodiment.

Further, in this EL display apparatus, the EL light emitting layer 32 provided on one surface of the printed wiring board 25 is electrically connected to the drive component provided on the other surface of the printed wiring board 25, so that as shown in FIG. 2, a planar region specialized for electrically connecting the EL light emitting layer 32 to the drive component therefor is not required. Accordingly, as shown in FIG. 3, by flatly sticking a plurality of the printed wiring boards 25 to each other, it is possible to uniformly, flatly arrange the EL light emitting layers 32, and hence to display a large-sized picture without any cut line.

A method of fabricating a printed wiring board and an EL display apparatus according to the second embodiment of the present invention will be described with reference to FIGS. 7 to 9D.

Figure 8A:
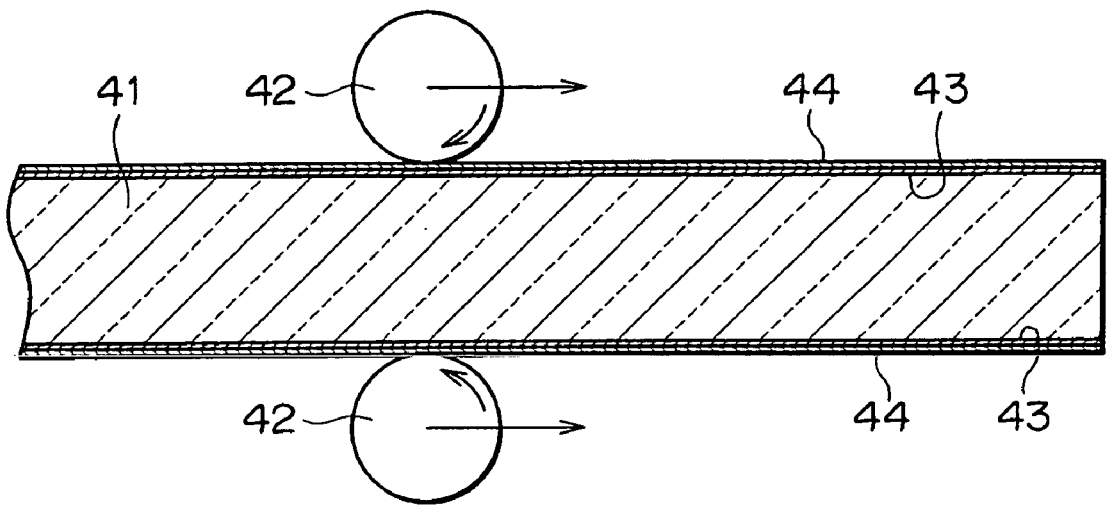
FIGS. 8A to 8C are partial sectional side views showing, in sequence, the first half steps of fabricating the EL display apparatus according to the second embodiment.
Figure 8B:
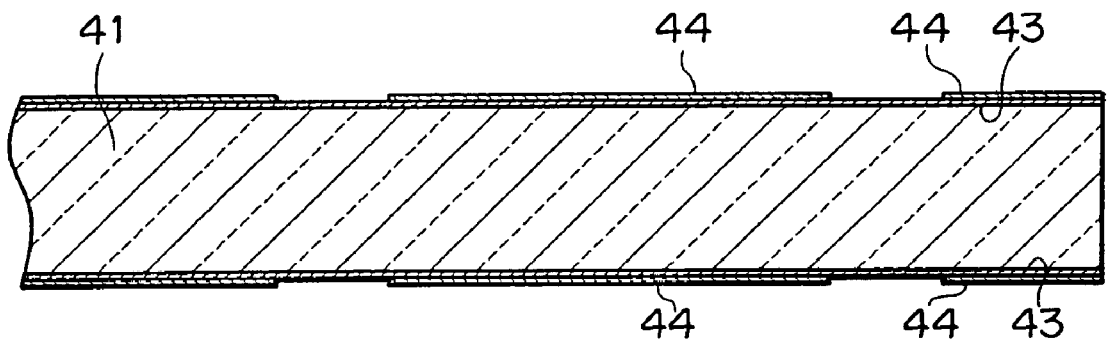

First, as shown in FIG. 8A, a glass substrate 41 of 1.1 mm in thickness made from a no-alkali glass is prepared. Epoxy resin films with copper foils are press-bonded on both surfaces of the glass substrate 41 by using hot rolls 42. In this way, an epoxy resin film 43 of 40 µm in thickness and a copper foil 44 of 18 µm in thickness provided thereon are formed overall on each surface of the glass substrate 41. Then, as shown in FIG. 8B, portions of the copper foils 44, located at positions where through-holes corresponding to anode electrodes and cathode electrodes necessary for a simple matrix type EL display apparatus are to be formed, are removed by etching, or the surfaces of the copper foils 44 are overall removed by etching.

Figure 8C:
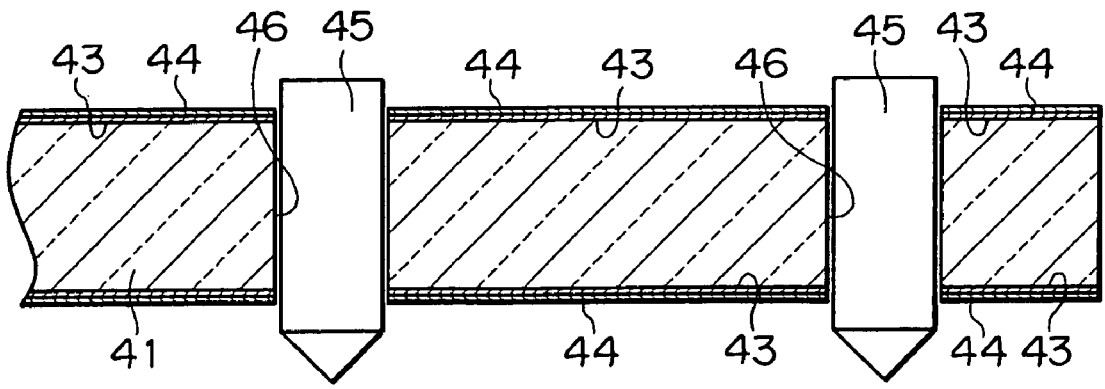

As shown in FIG. 8C, like the fabrication step in the first embodiment shown in FIG. 4A, through-holes 46 corresponding to the anode electrodes and cathode electrodes necessary for the simple matrix type EL display apparatus are formed in the glass substrate 41 by using a diamond drill 45. Upon formation of the through-holes 46, since at least the portions of the copper foils 44 located at the positions where the through-holes 46 are to be formed have been already removed as described above, particles of copper softer than glass do not clog spaces among fine particles of diamond of the diamond drill 45. This is effective to eliminate inconveniences caused by clogging of the diamond drill 45 with copper particles, and more specifically, prevent degradation of the drilling performance of the diamond drill 45, breakage of the diamond drill 45, and cracking of the glass substrate 41.

Figure 9A:
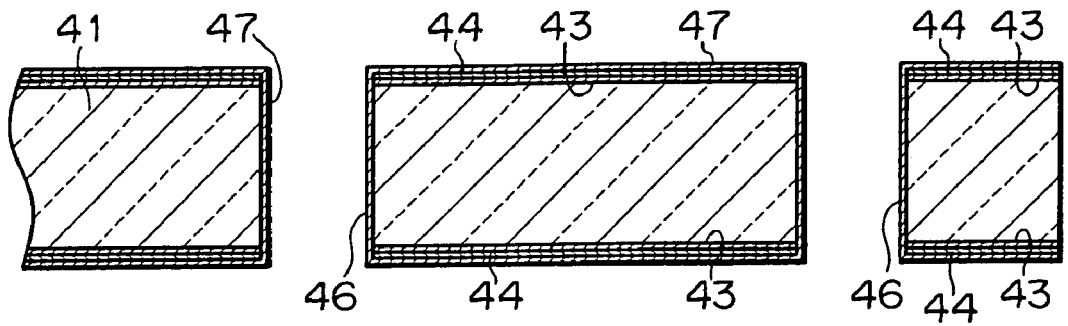
FIGS. 9A to 9D are partial sectional side views showing, in sequence, the second half steps of fabricating the EL display apparatus according to the second embodiment.

As shown in FIG. 9A, thin copper electroless plating and thick copper electroplating are sequentially performed on the glass substrate 41, to form a copper film 47 having a thickness of 20 to 30 µm overall on both the surfaces of the glass substrate 41 including the inner wall surfaces of the through-holes 46. It should be noted that even if the surfaces of the copper foils 44 are overall removed by etching before the formation of the through-holes 46 as described above, since the copper film 47 is formed overall on both the surfaces of the glass substrate 41, it is possible not only to form conductive patterns with no problem but also to simplify the fabrication steps by eliminating the need of forming masks for partially covering the copper foils.

Figure 9B:
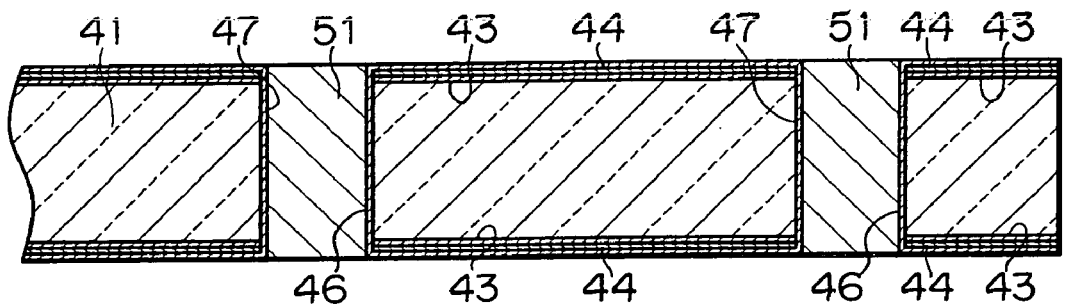

Since the epoxy resin film 43 is interposed between the stack of the copper foil 44 and the copper film 47 and the glass substrate 41, a force of 9.8 N or more is required to be applied for peeling the stack (width: 1 cm) of the copper foil 44 and the copper film 47 from the glass substrate 41. That is to say, it is possible to obtain a practically sufficient adhesive strength between the stack of the copper foil 44 and the copper film 47 and the glass substrate 41. Then, as shown in FIG. 9B, an inner space, inside the copper film 47, of each of the through-holes 46 is filled with an epoxy resin 51, followed by thermal hardening of the epoxy resin 51, and an excess of the epoxy resin 51 on both the surfaces of the glass substrate 41 is mechanically polished until the upper surfaces of the epoxy resin 51 portions in the through-holes 46 become the same level as that of the copper film 47.

Figure 9C:
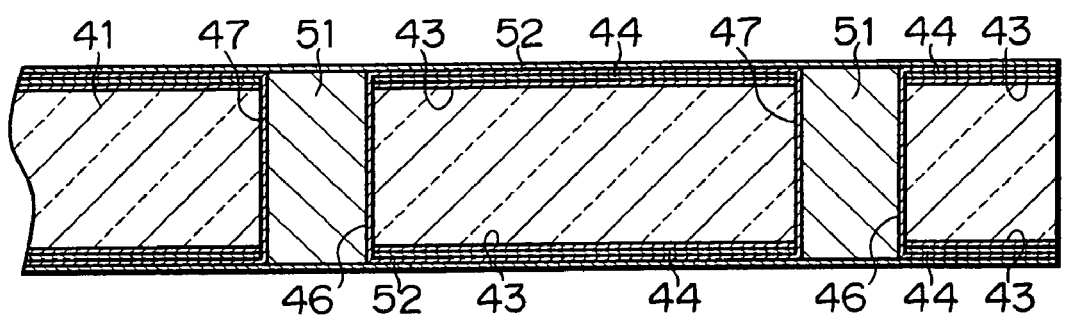
Figure 9D:
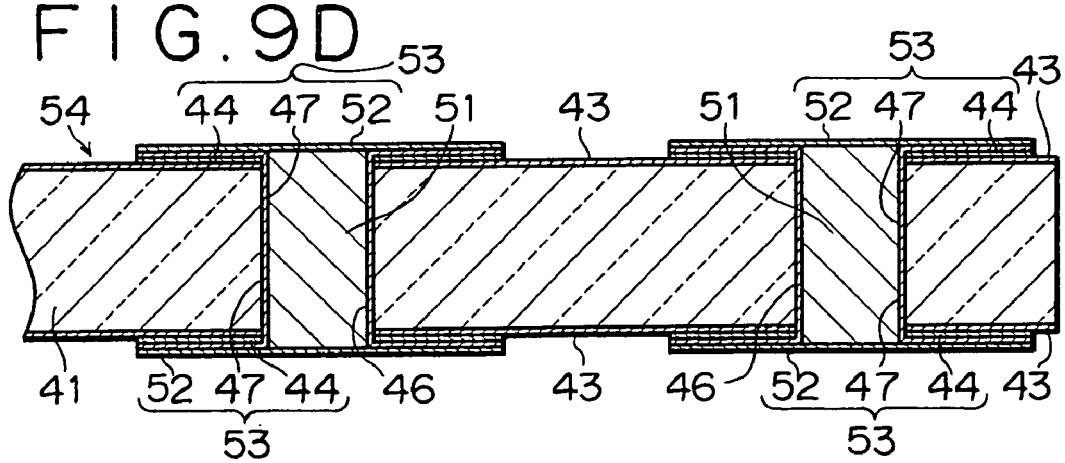

As shown in FIG. 9C, copper electroless plating and copper electroplating are sequentially performed on the glass substrate 41, to form a copper film 52 having a thickness of 5 to 20 μm overall on both the surfaces of the glass substrate 41 including the upper surfaces of the epoxy resin 51 portions exposed from the through-holes 46. Then, as shown in FIG. 9D, on each side of the glass substrate 41, the stack of the copper films 52 and 47 and the copper foil 44, except for portions at which a conductive pattern is to be formed, is removed by etching, to thereby form a conductive pattern 53 composed of the stack of the copper foil 44 and the copper films 47 and 52. In this way, a printed wiring board 54, in which the conductive patterns 53 on both the surfaces of the glass substrate 41 are made conductive to each other via the copper film 47 in the through-holes 46, is formed.

Figure 7:
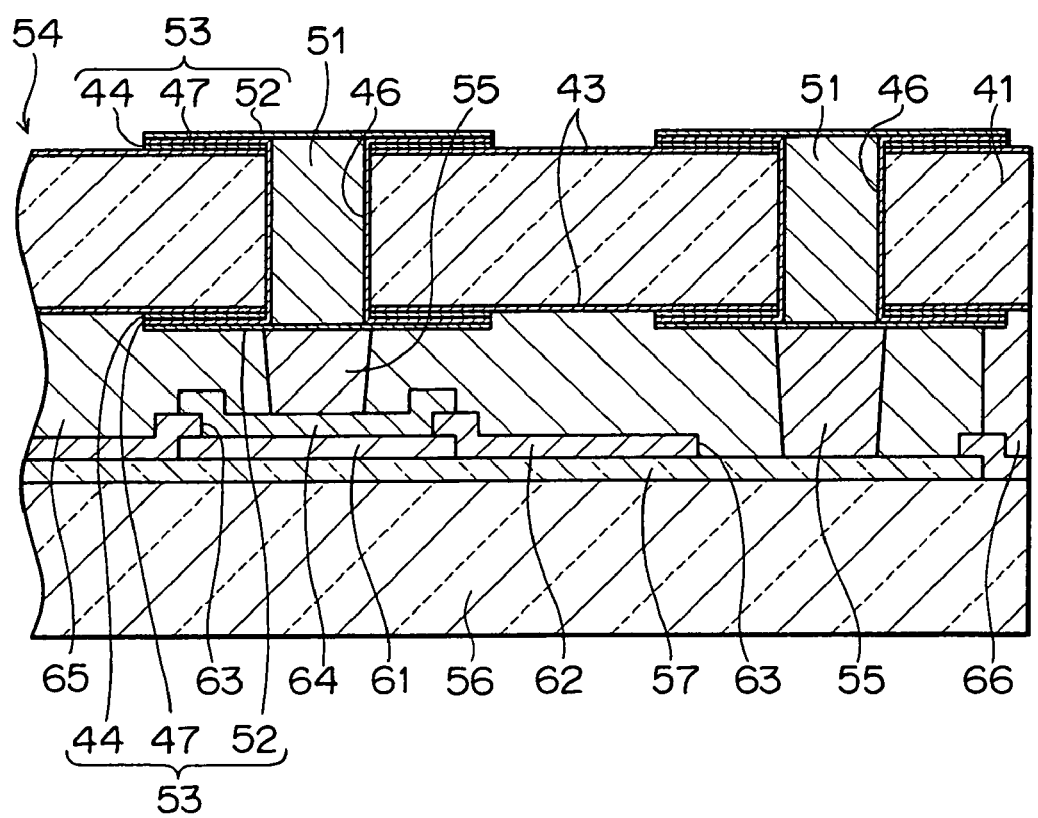
FIG. 7 is a partial sectional side view of an EL display apparatus according to a second embodiment of the present invention.

As shown in FIG. 7, conductive bumps 55 made from a metal are formed on one surface of the printed wiring board 54. On the other hand, an ITO film or the like is vapor-deposited on one surface of a protective glass board 56 made from a no-alkali glass, and is patterned typically in the row direction to form anode electrodes 57. An organic or inorganic EL light emitting layer 61 is vapor-deposited on the anode-electrodes 57 and the like, and is patterned to remain at display pixels which are intersections between the anode electrodes 57 and cathode electrodes.

An insulating film 62 is vapor-deposited on the EL light emitting layer 61 and the like, and openings 63 are formed in the insulating film 62 at connection portions between the anode electrodes 57 and the bumps 55 and connection portions between the EL light emitting layer 61 and cathode electrodes. An aluminum film is vapor-deposited on the insulating film 62 and the like, and is patterned typically in the column direction to form cathode electrodes 64. An adhesive bond layer 65 is formed on the protective glass board 56. The adhesive bond layer 65 is made from a resin which is thermally plasticized at a relatively low temperature, for example, polyester, polyvinyl chloride, polyvinyl acetate, polyamide, or polyurethane.

The anode electrodes 57 and the cathode electrodes 64 are positioned to the corresponding bumps 55. The adhesive bond layer 65 is heated up to its softening temperature, and in such a state, the bumps 55 are press-bonded to the anode electrodes 57 and the cathode electrodes 64. Then, the adhesive bond layer 65 is cooled to be thus hardened. As a result, the anode electrodes 57 and the cathode electrodes 64 are electrically connected to the corresponding bumps 55, and simultaneously the printed wiring board 54 is stuck on the protective glass board 56.

An epoxy resin 66 is applied to respective peripheral portions of the printed wiring board 54 and the protective glass board 56. A drive component (not shown) for driving the EL light emitting layer 61 is soldered to the conductive pattern 53 formed on the surface, opposite to the bumps 55, of the printed wiring board 54. An EL display apparatus according to the second embodiment is thus fabricated. Like the EL display apparatus according to the first embodiment, the EL display apparatus according to this embodiment does not require any planar region specialized for electrically connecting the EL light emitting layer 61 to the drive component therefore. Accordingly, it is possible to uniformly, flatly arrange the EL light emitting layer 61 by flatly sticking a plurality of the printed wiring boards 54 to each other and also flatly sticking the protective glass boards 56 to each other, and hence to display a large-sized picture without any cut line.

In this EL display apparatus in which the printed wiring board 54 is stuck on the protective glass board 56 via the adhesive bond layer 65, since the linear expansion coefficient of the glass substrate 41 of the printed wiring board 54 is equal to that of the protective glass board 56, it is possible to prevent the reliability of the sticking plane from being lowered due to the thermal expansion/contraction. Further, since the glass substrate 41 of the printed wiring board 54 is not required to be baked at a high temperature unlike a ceramic substrate, the glass substrate does not suffer from dimensional change and warping due to baking at a high temperature and can be easily stuck on the protective glass board.

By the way, in the first embodiment, the EL light emitting layer 32 is formed on the printed wiring board 25 having the through-holes 13 filled with the silver paste 15, and in the second embodiment, the bumps 55 are formed but the EL light emitting layer 61 is not formed on the printed wiring board 54 having the through-holes 46 on the inner wall surfaces of which the copper film 47 is formed. However, in the first embodiment, bumps may be formed but the EL light emitting layer be not formed on the printed wiring board 25 having the through-holes 13 filled with the silver paste 15, and in the second embodiment, the EL light emitting layer 32 may be formed on the printed wiring board 54 having the through-holes 46 on the inner wall surfaces of which the copper film 47 is formed.

The glass substrate 11 of the printed wiring board 25 in the first embodiment and the glass substrate 41 of the printed wiring board 54 in the second embodiment are each made from a no-alkali glass which has a desirable property, that is, a high insulation performance; however, the substrate 11 and 41 are each not necessarily made from a no-alkali glass.

The through-holes 13 of the printed wiring board 25 in the first embodiment are filled with the silver paste 15 containing an epoxy resin as a binder, and the through-holes 46 of the printed wiring board 54 in the second embodiment are filled with the epoxy resin 51; however, the through-holes 13 may be filled with a conductive paste other than the silver paste 15 containing a sealing material other than the epoxy resin as a binder, and the through-holes 46 may be filleu with a sealing material other than the epoxy resin 51.

In each of the first and second embodiments, the present invention is applied to the simple matrix type EL display apparatus and the printed wiring board used therefor; however, the present invention can be applied to an EL display apparatus other than the simple matrix type and a printed wiring board used therefor, and also to a display apparatus other than the EL display apparatus, for example, a liquid crystal display apparatus or plasma display apparatus and a printed wiring board used therefor.

In the printed wiring board according to the first invention, by electrically connecting circuit parts to be electrically connected to each other to the conductive patterns provided on both the surfaces of the printed wiring board, it is possible to electrically connect these circuit parts to each other without use of any planar specialized region, and hence to uniformly, flatly arrange a plurality of desired circuit parts by flatly sticking a plurality of printed wiring boards to each other. Further, since moisture is not allowed to permeate the printed wiring board and reach the circuit parts although the printed wiring board constitutes part of the package for the circuit parts, the circuit parts pool in moisture resistance can be stably operated for a long-period of time.

In the printed wiring board according to the second invention, even when a voltage is applied to the glass substrate via the conductive patterns on both the surfaces of the glass substrate, the glass substrate being less susceptible to ion migration causes less insulation failure. As a result, it is possible to enhance the reliability of the printed wiring board.

In the printed wiring board according to the third invention, it is possible to easily carry out the works of making the conductive patterns on both the surfaces of the glass substrate conductive to each other and of sealing the through-holes, and hence to reduce the fabrication cost.

In the printed wiring board according to the fourth invention, it is possible to connect the conductive patterns on both the surfaces of the glass substrate to each other with a low resistance, and hence to operate the circuit parts electrically connected to the conductive patterns at a high speed and a low power consumption.

In the printed wiring board according to each of the fifth and sixth inventions, it is possible to enhance the sealing performance at the through-holes of the glass substrate, and hence to stably operate the circuit parts poor in moisture resistance for a long-period of time.

In the printed wiring board according to the seventh invention, since the conductive patterns are less peeled from the glass substrate, the reliability can be enhanced. Further, since the resistance of each conductive pattern is low, it is possible to operate the circuit parts electrically connected to the conductive patterns at a high speed and a low power consumption.

In the printed wiring board according to the eighth invention, since each conductive pattern having a low resistance can be simply formed, it is possible to reduce the fabrication cost. Further, since the resistance of each conductive pattern is low, it is possible to operate the circuit parts electrically connected to the conductive patterns at a high speed and a low power consumption.

In the display apparatus according to each of the ninth and tenth inventions, it is possible to eliminate the need of providing any region specialized for electrically connecting the display device to the drive component therefore. Accordingly, by flatly sticking a plurality of the printed wiring boards to each other, it is possible to display a large-sized picture without any cut line. Also, it is possible to reduce the total thickness of the display device, drive component therefor, and printed wiring board, and hence to make thin the entire EL display apparatus. Further, since moisture does not reach the display device, even if the moisture resistance of the display device is low, it is possible to stably display a picture for a long-period of time.

While the preferred embodiments of the present invention have been described using the specific terms, such description is for illustrative purposes only, and it is to be understood that changes and variations may be made without departing from the spirit or scope of the following claims.

What is claimed is:

1. A display apparatus comprising:
   a printed wiring board including a glass substrate provided with through-holes, the glass substrate having a sealed side surface to be sealed from moisture and an exposed side surface, conductive patterns provided on each surface of said glass substrate wherein a conductive pattern on the sealed surface of said glass substrate is in electrical communication with a conductive pattern on the exposed side surface via said through-holes, the conductive patterns on said sealed side surface being connected to at least one display element, and a first sealing member provided to fill said through-holes;
   a display device provided on one surface of said printed wiring board in such a manner as to be connected to said conductive pattern provided on said one surface of said printed wiring board;
   a drive component for driving said display device, said drive component being disposed on the exposed surface of said printed wiring board in such a manner as to be connected to said conductive pattern provided on said other surface of said printed wiring board;
   a protective glass board disposed in such a manner as to face to said one surface of said printed wiring board; and
   a second sealing member provided in such a manner as to surround said display device while being in contact with said printed wiring board and said protective glass board.

2. A display apparatus according to claim 1, wherein said glass substrate is a no-alkali glass substrate.

3. A display apparatus according to claim 1, wherein said first sealing member is a conductive paste containing an epoxy resin as a binder.

4. A display apparatus according to claim 1, wherein a conductive film is provided on an inner wall surface of each of said through-holes in such a manner as to connect said conductive patterns provided on both surfaces of said glass substrate to each other, and
   an inner space, inside said conductive film, of said through-hole is filled with said first sealing member.

5. A display apparatus according to claim 4, wherein said second sealing member is an epoxy resin.

6. A display apparatus according to claim 4, wherein the surface of said first sealing member exposed from each of said through-holes is covered with a metal film.

7. A display apparatus comprising:
   a printed wiring board including a glass substrate provided with through-holes, the glass substrate having a sealed side surface to be sealed from moisture and an exposed side surface, conductive patterns provided on each surface of said glass substrate wherein a conductive pattern on the sealed surface of said glass substrate is in electrical communication with a conductive pattern on the exposed side surface via said through-holes, the conductive patterns on said sealed side surface being connected to at least one display element, and a first sealing member provided to fill said through-holes;
   bumps provided on said conductive pattern provided on one surface of said printed wiring board;
   a protective glass board disposed in such a manner as to face to said one surface of said printed wiring board;
   a display device provided on the surface, facing to said printed wiring board, of said protective glass board in such a manner as to be connected to said bumps;
   a drive component for driving said display device, said drive component being disposed on the other surface of said printed wiring board in such a manner as to be connected to said conductive pattern provided on said exposed surface of said printed wiring board; and
   a second sealing member provided in such a manner as to surround said display device while being in contact with said printed wiring board and said protective glass board.

8. A display apparatus according to claim 7, wherein said glass substrate is a no-alkali glass substrate.

9. A display apparatus according to claim 7, wherein said first sealing member is a conductive paste containing an epoxy resin as a binder.

10. A display apparatus according to claim 7, wherein a conductive film is provided on an inner wall surface of each of said through-holes in such a manner as to connect said conductive patterns provided on both surfaces of said glass substrate to each other, and an inner space, inside and conductive film, of said through-hole is filled with said first sealing member.

11. A display apparatus according to claim 10, wherein said first sealing member is an epoxy resin.

12. A display apparatus according to claim 10, wherein the surface of said first sealing member exposed from each of said first sealing member exposed from each of said through-holes is covered with a metal film.

\* \* \* \* \*